United States Patent
Badel et al.

(10) Patent No.: US 8,694,941 B1
(45) Date of Patent: Apr. 8, 2014

(54) SYSTEM AND METHOD FOR ABUTMENT IN THE PRESENCE OF DUMMY SHAPES

(75) Inventors: Olivier Badel, Mandelieu (FR); Kenny Ferguson, Edinburgh (GB); Gilles Lamant, Sunnyvale, CA (US); David Mallon, Aberdour Fife (GB); Ted Paone, Cedar Park, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/570,942

(22) Filed: Aug. 9, 2012

Related U.S. Application Data (60) Provisional application No. 61/654,691, filed on Jun. 1, 2012.

(51) Int. Cl.
*G06F 17/50* (2006.01)

(52) U.S. Cl.
CPC ................................. *G06F 17/5072* (2013.01)
USPC .......................................... 716/122; 716/132

(58) Field of Classification Search
None
See application file for complete search history.

(56) References Cited

U.S. PATENT DOCUMENTS

| | | | |
|---|---|---|---|
| 6,671,866 B2 | 12/2003 | Arsintescu | |
| 7,543,262 B2 * | 6/2009 | Wang et al. | 716/119 |
| 7,546,556 B1 | 6/2009 | Wagner | |
| 7,555,739 B1 | 6/2009 | Ginetti et al. | |
| 7,932,566 B2 | 4/2011 | Hou et al. | |
| 7,971,175 B2 | 6/2011 | Ginetti et al. | |
| 8,046,730 B1 | 10/2011 | Ferguson et al. | |
| 8,281,272 B1 | 10/2012 | Ginetti | |
| 2011/0307854 A1 | 12/2011 | Lu et al. | |
| 2012/0144361 A1 | 6/2012 | Cheng et al. | |
| 2012/0233576 A1 | 9/2012 | Barrows et al. | |
| 2012/0266126 A1 * | 10/2012 | Chern et al. | 716/136 |
| 2013/0042216 A1 | 2/2013 | Loh et al. | |

FOREIGN PATENT DOCUMENTS

WO    WO 2009082403 A1    7/2009

OTHER PUBLICATIONS

Velasco et al., "An efficient algorithm for optimal pairing and chaining layout generation," 1996 IEEE Int'l Symp. on Circuits and Systems, vol. 4, pp. 775-778.*
Velasco et al., "A Combined Pairing and Chaining Algorithm for CMOS Layout Generation," 1996 IEEE, p. 609.*
Chen et al., "Transistor Permutation for Better Transistor Chaining," 2009 IEEE, pp. 1276-1279.*
Lin et al., "A Graph-Theoretical Approach to Transistor Placement in CMOS Cell Layout," 1990 IEEE, pp. 551-554.*

(Continued)

*Primary Examiner* — Leigh Garbowski
(74) *Attorney, Agent, or Firm* — Kenyon & Kenyon LLP (57) ABSTRACT

A system and method for optimizing a design layout by identifying features for abutment where the shapes that trigger the abutment are overlapping, within a predefined proximity of each other, or are interface elements for features having a short circuit. The abutment process may identify shapes for abutment that are not connected to a netlist of the design or are otherwise not associated with a connection pin. The abutment process may adjust a shape or feature including, for example by resizing, moving, inserting, or removing one or more shapes from the layout in accordance with predefined layout rules. After the shapes and features have been adjusted abutments may be formed between the features.

18 Claims, 12 Drawing Sheets

(56) References Cited

OTHER PUBLICATIONS

Liberali et al., "Automatic Generation of Transistor Stacks for CMOS Analog Layout," 1993 IEEE, pp. 2098-2101.*

Hwang et al., "A Fast Transistor-Chaining Algorithm for CMOS Cell Layout," IEEE Trans. on CAD, vol. 9, No. 7, Jul. 1990, pp. 781-786.*

Pranav Bhushan, "Schematic PCell Implementation in Virtuoso Platform"; Proceedings of the International Cadence Users Group Conference, Santa Clara, CA; Sep. 13-15, 2004; 12 pages.

Cadence Design Systems, Inc., "Product Documentation", Virtuoso® Layout Suite XL User Guide, Product Version 6.1.5, Mar. 5, 2012, pp. 1/2 to 22/2.

* cited by examiner

SYSTEM AND METHOD FOR ABUTMENT IN THE PRESENCE OF DUMMY SHAPES

RELATED APPLICATIONS

This application claims benefit under 35 U.S.C. §119(e) of U.S. Provisional Application Nos. 61/654,691, filed Jun. 1, 2012, incorporated herein by reference in its entirety.

BACKGROUND

Aspects of the present invention relate generally to the field of integrated circuit design, and more specifically to systems and methods to optimize a design layout having dummy or supporting shapes.

Integrated circuit (IC) design is increasingly complex, sometimes involving millions of elements, shapes or geometries, and may be facilitated with an electronic design automation (EDA) tool that allows a designer to interactively position ("place") and connect ("route") various shapes on the circuit. The EDA tool then creates a circuit layout containing the physical locations and dimensions of the circuit's components, interconnections, and various layers from the original design that may then be fabricated, creating the IC. The designed IC is eventually fabricated by transferring or printing the circuit layout to a semiconductor substrate in a series of layers that collectively will form the features that constitute the devices that make up the components of the integrated circuit.

As part of the circuit design, collections of shapes forming features or devices are inserted into the circuit design as a programmed cell to perform a predefined function. The connections between the features or devices on the circuit are defined with a netlist.

After or during the design and creation of an IC layout, validation and/or optimization operations are often performed on the IC layout using a set of testing, analysis and validation tools. These operations are conventionally performed in part to detect variations in the as-designed layout that may occur during printing due to the optical and/or chemical nature of the processing used to manufacture the IC. For example, optical distortions during the lithography process may cause variations in feature dimensions (e.g. line widths) that are patterned using masks. Optical proximity correction (OPC) tools make small changes to the layout, for example adjusting line widths or adding rounded corners to the design layout, so that the design layout and the printed circuit more closely align. As part of the validation/optimization process, connectivity errors are identified and corrected.

During layout optimization, where the connected features are placed in the design such that the connection includes shapes that are overlapping, the shapes may be adjusted such that the overlapping shapes share an associated pin. However, for shapes not connected via a net connection, the abutment optimization process is not triggered. As a result, shapes in close proximity are not properly optimized by the conventional abutment procedure and the management of such supporting shapes requires manual manipulation of the design layout. Such manual manipulation is time consuming and often fraught with errors.

Accordingly, there is a need in the art to ensure effective IC design by automatically adding, removing, or otherwise adjusting dummy or supporting shapes and triggering an abutment procedure for those shapes.

BRIEF DESCRIPTION OF THE DRAWINGS

The foregoing and other aspects of various embodiments of the present invention will be apparent through examination of the following detailed description thereof in conjunction with the accompanying drawing figures in which similar reference numbers are used to indicate functionally similar elements.

DETAILED DESCRIPTION

As part of the optimization process, the proximity of two elements in a design may trigger an abutment process wherein the elements are adjusted resized, realigned, or merged, or one or more supporting or 'dummy' shapes may be inserted into the layout or removed from the layout in order to optimize the physical or electrical behavior of the elements. As used herein, 'dummy' or supporting shapes shall refer to shapes added to a feature or between features to ensure correct electrical behavior or correct physical fabrication, and/or otherwise support the integrated circuit manufacturing process. Supporting shapes need not be connected to a net. The abutment process may be triggered by overlapping shapes including overlapping shapes which may have no connectivity directly associated with them, and no pins. After devices have been adjusted abutments may be formed between the remaining shapes.

Figure 1A:
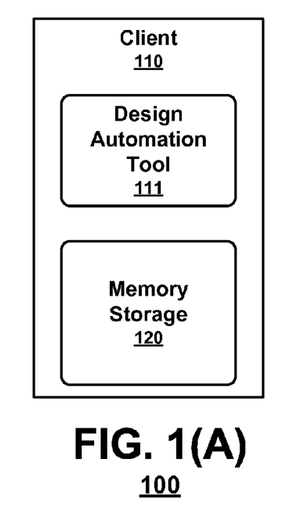
FIGS. 1(A)-(B) are simple block diagrams illustrating components of an exemplary system according to an embodiment of the present invention.

A user may access an integrated circuit design editor or other design layout tool utilizing supporting shape abutment tools in a standalone client system, client-server environment, or a networked environment. FIG. 1(A) is a simple block diagram illustrating components of an exemplary system 100 according to an embodiment. As shown in FIG. 1(A), a system 100 may comprise a client 110 executing a design automation tool 111 and having a memory storage 120. The client 110 may be any computing system that executes a design automation tool 111 or otherwise facilitates access to memory storage 120 storing layouts and pattern libraries.

Layouts, pattern libraries, and other objects utilized by the design automation tool 111 may be stored in memory storage 120. Layout and design rules may additionally be stored in the memory storage 120. Layout rules may be derived from the design rules of a fabrication process and may include limitations on the design features that may require adjustments to the features and shapes. For example, the layout rules may include rules for the sizing and spacing of features such that compliance with the rules may require the addition, removal, or resizing of shapes. Additionally, neighboring features near a pair of abutted features may be analyzed to determine which shapes should be added or removed, and which shapes should remain and be abutted. These layout rules may be encoded as part of an abutment process that may be implemented as part of an optimization tool. For example, in accordance with an exemplary embodiment, the layout rules for the abutment process may be defined using the SKILL language.

A user may access the layouts and run the optimization procedures stored in memory storage 120 with the client 110 via a design automation tool 111 capable of accessing memory storage 120 and displaying the layouts and related circuit design data stored therein. The design automation tool 111 may include a user interface, for example a program, application or middleware that acts as a frontend to and facilitates access to objects in memory storage 120, for example, a schematic or circuit design editor or other design editing application. The design automation tool 111 may facilitate an analysis of a design layout to identify features for abutment and perform the abutment procedures described herein. The user may interact with the design automation tool 111 through a number of input devices, such as by inputting a selection as with a mouse or inputting a request as with a keyboard. The user may observe the response to the access request on an output device or display. The design automation tool 111 may run in an application window controlled by the user.

Figure 1B:
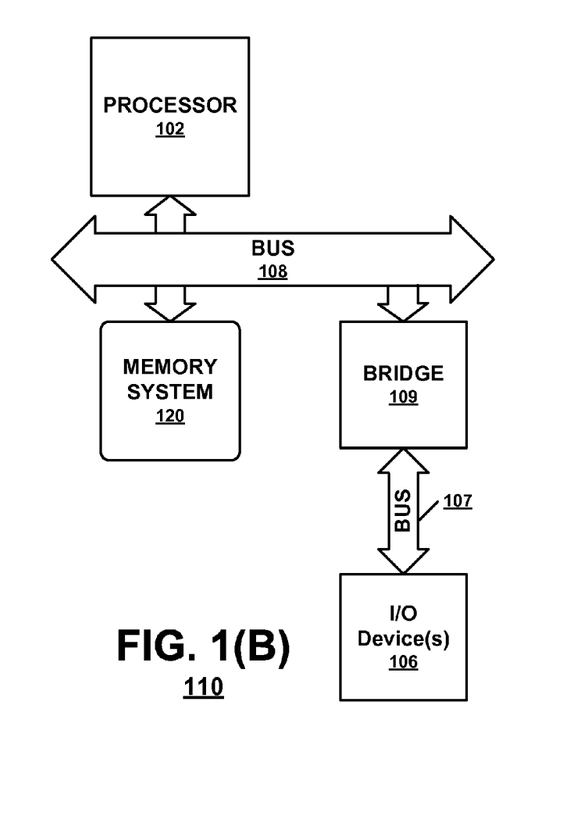

FIG. 1(B) is a simple block diagram illustrating components of an exemplary client 110 according to an embodiment of the present invention. As shown in FIG. 1(B), the client 110 may include a processor 102, a memory system 120 and one or more input/output (I/O) devices 106 for communication. The communication can be implemented in a variety of ways and may include one or more computer buses 107, 108 and/or bridge devices 109 as shown in FIG. 1(B). The I/O devices 106 can include network adapters and/or mass storage devices from which the client 110 can receive commands for executing the design automation tools 111.

As shown in FIG. 1(A), a client 110 may be a stand-alone system, as may be of particular interest where the designs being developed are highly confidential. Additionally, according to an aspect of an embodiment as shown in FIG. 2, a client 210 may be part of a networked environment.

Figure 2:
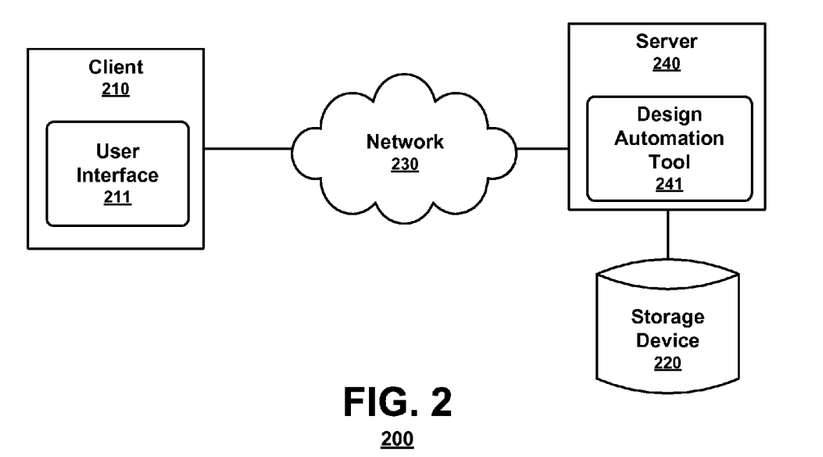
FIG. 2 is a simple block diagram illustrating components of an exemplary system according to an embodiment of the present invention.

FIG. 2 is a simple block diagram illustrating components of an exemplary system 200 according to an embodiment. As shown in FIG. 2, system 200 may comprise a client 210 having a user interface 211. The client 210 may be connected to a server 240 via a network 230. The design automation tool 241 may have access to a memory storage device 220 storing layouts, pattern libraries, and other objects utilized by the design automation tool 241. A user may access a design automation tool 241 at the server via the client 210 having a user interface 211 capable of accessing and displaying stored layouts and optimization procedures. The client 210 may be any computing system that facilitates the user accessing memory storage 220. The network 230 may be a wired or wireless network that may include a local area network (LAN), a wireless area network (WAN), the Internet, or any other network available for accessing memory storage 220 from the client 210.

The server 240 may be a network server accessible to the client 210 via the network 230 that may manage access to memory storage 220. The user interface 211 may receive instructions regarding a layout design from the user and utilizing the optimization procedures stored in memory storage 220, facilitate optimization of the layout design and the execution of an abutment process. Multiple different clients (not shown) may access memory storage 220 via the network 230 and request access to the objects stored therein.

In another networked environment, the design automation tool may be executed on a network capable client and access the layout, pattern libraries and other objects stored in memory storage via a network and communications server.

Figure 3:
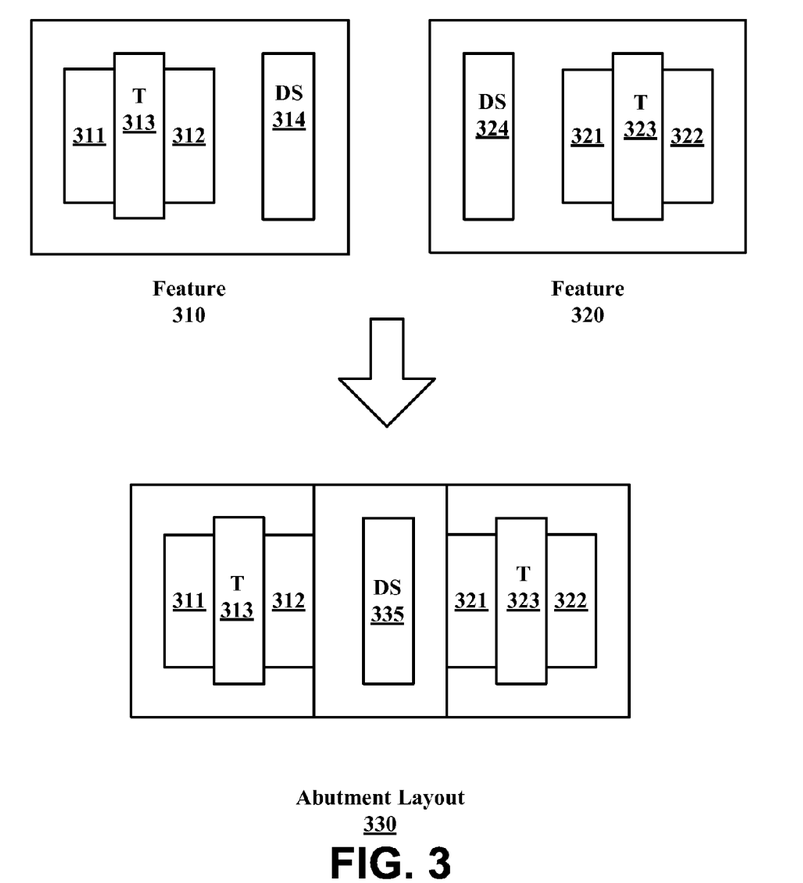
FIGS. 3-9 are simple block diagrams illustrating exemplary optimizations of a layout using the abutment process according to an embodiment of the present invention.

FIG. 3 is a simplified block diagram illustrating an exemplary optimization of a layout using an abutment process according to an embodiment. During a layout optimization process, an abutment process may identify two or more devices in proximity as candidates for abutment according to the applicable layout rules. Devices in proximity may be identified as features having shapes within a predetermined distance. The features may be identified for abutment if two shapes on respective features may be in close proximity or overlapping each other, with or without associated pins.

As shown in FIG. 3, an exemplary design may be comprised of two features 310, 320. A first feature 310 may include a transistor T 313, net connections 311 and 312, and dummy shape DS 314. A second feature 320 may include a transistor T 323, net connections 321 and 322, and dummy shape DS 324. In the illustrated example, a layout rule may require at least one dummy shape per transistor in the un-abutted layout. Then if the two features 310, 320 have dummy shapes DS 314 and DS 324 in close proximity or overlapping, the abutment process may overlap the adjacent dummy shapes and eliminate one of the shapes. Then the resultant abutment layout 330 may include a first and a second transistor T 313, T 323, net connections 311, 312, 321, and 322, and a single dummy shape 335.

Figure 4:
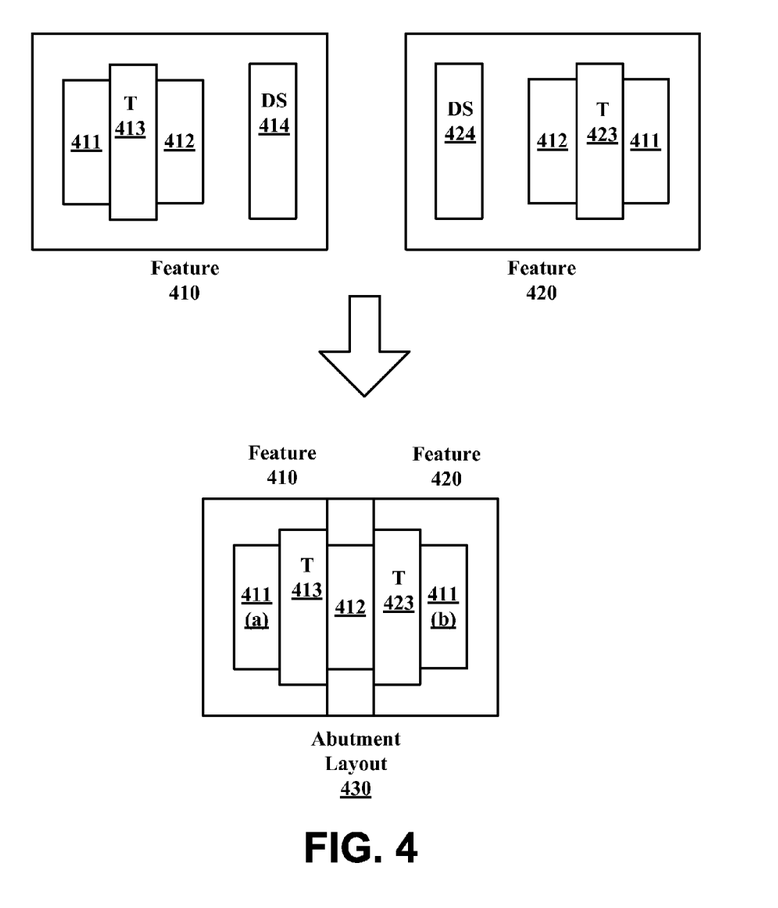

FIG. 4 is a simplified block diagram illustrating another exemplary optimization of a layout using an abutment process according to an embodiment. As previously noted, during a layout optimization process, an abutment process may identify two or more devices in proximity as candidates for abutment according to the applicable layout rules.

As shown in FIG. 4, an exemplary design may be comprised of two features 410, 420. A first feature 410 may include a transistor T 413, net connections 411 and 412, and dummy shape DS 414. As shown, the transistors T 413 and T 423 may each be connected to the same source 411 and the same drain 412. A second feature 420 may include a transistor T 423, net connections 411 and 412, and dummy shape DS 424. As above, in this exemplary optimization, a layout rule may require at least one dummy shape per transistor in the un-abutted layout. Then if the two features 410, 420 have dummy shapes DS 414 and DS 424 in close proximity or overlapping, the abutment process may eliminate the adjacent dummy shapes DS 414 and DS 424 and the interface shapes 412 in each feature may be merged. Then the resultant abutment layout 430 may include a first and a second transistor T 413, T 423, net connections 411(a) and 411(b), 412.

The dummy shapes 414 and 424 have been optimized away. As shown, the shapes and/or pins triggering the abutment process need not exist after the abutment process has completed. Shapes may be inserted or removed from within a feature or at the interface between two features and allows for greater optimization. As used herein, the term 'interface shapes' may be understood to refer to the shapes that may trigger the abutment process.

Figure 5:
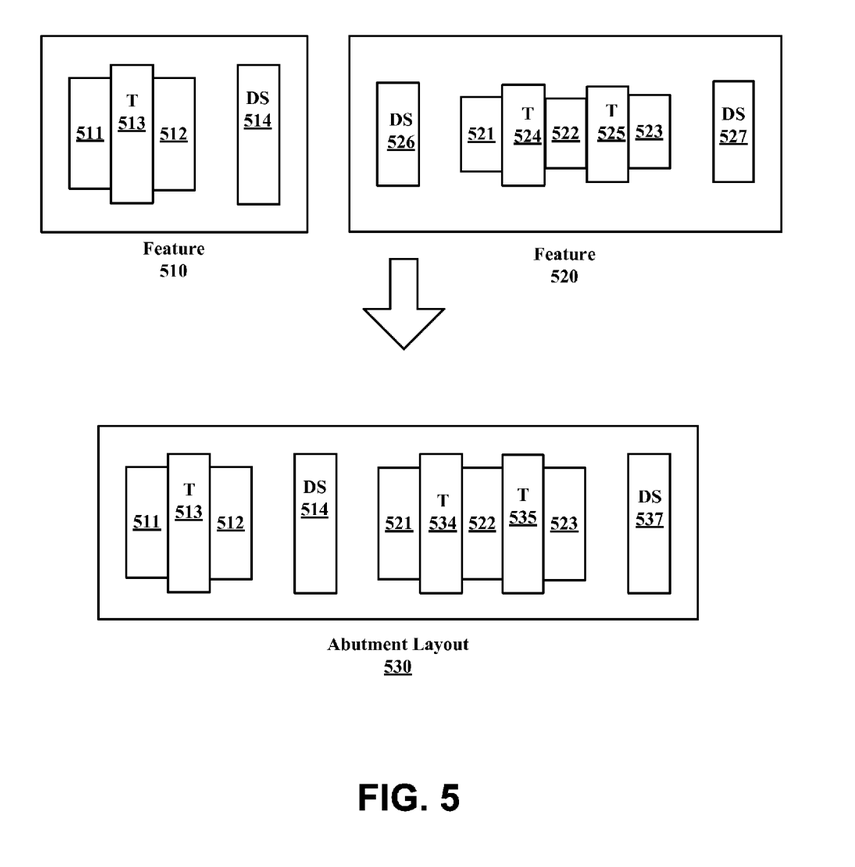

FIG. 5 is a simplified block diagram illustrating another exemplary optimization of a layout using an abutment process according to an embodiment. As shown in FIG. 5, an exemplary design may be comprised of two features 510, 520. A first feature 510 may include a transistor T 513, net connections 511 and 512, and dummy shape DS 514. A second feature 520 may include dummy shapes DS 526 and DS 527 and a device chain having transistors T 524, T 525 and net connections 521, 522 and 523.

Then if the two features 510, 520 have dummy shapes DS 514 and DS 526 in close proximity or overlapping, the abutment process may overlap the adjacent dummy shapes and eliminate one of the shapes as well as resize the gates and dummy shapes in feature 520. Then the resultant abutment layout 530 may include three transistors T 513, T 534, and 535, net connections 511, 512, 521, 522, and 523 and dummy shapes DS 514 and DS 537 such that the dummy shape 526 has been optimized away and transistors T 534 and 535 as well as dummy shape DS 537 have been resized.

In this exemplary optimization, a layout rule may require that all dummy shapes and gates in an abutted device chain have the same height. Thus, as shown, the shapes of the abutted features may be resized. Shapes of the neighboring features may additionally be resized or adjusted as required by the predefined layout rules (not shown).

Figure 6:
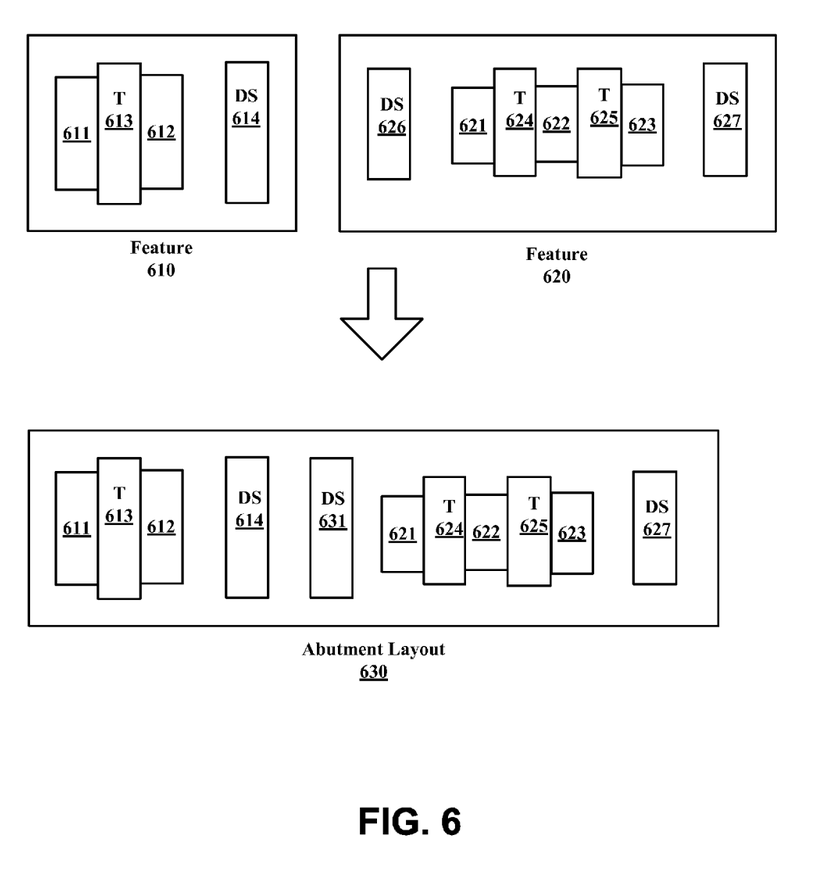

Similarly, FIG. 6 is a simplified block diagram illustrating another exemplary optimization of a layout using an abutment process according to an embodiment. As shown in FIG. 6, an exemplary design may be comprised of two features 610, 620. A first feature 610 may include a transistor T 613, net connections 611 and 612, and dummy shape DS 614. A second feature 620 may include dummy shapes DS 626 and DS 627 and a device chain having transistors T 624, T 625 and net connections 621, 622 and 623. Then if the two features 610, 620 have dummy shapes DS 614 and DS 626 in close proximity, the abutment process may resize the shapes of each of the features.

The resultant abutment layout 630 may include three transistors T 613, T 624, and 625, net connections 611, 612, 621, 622, and 623 and dummy shapes DS 614, DS 631 and DS 627. The dummy shape DS 626 has been resized to match the height of neighboring dummy shape DS614, and renumbered in the drawing as DS 631. In this exemplary optimization, a layout rule may require that a minimum number of dummy shapes and gates in an abutted device chain have the same height, for example, each gate or shape must be part of an adjacent row of three shapes at the same height.

Figure 7:
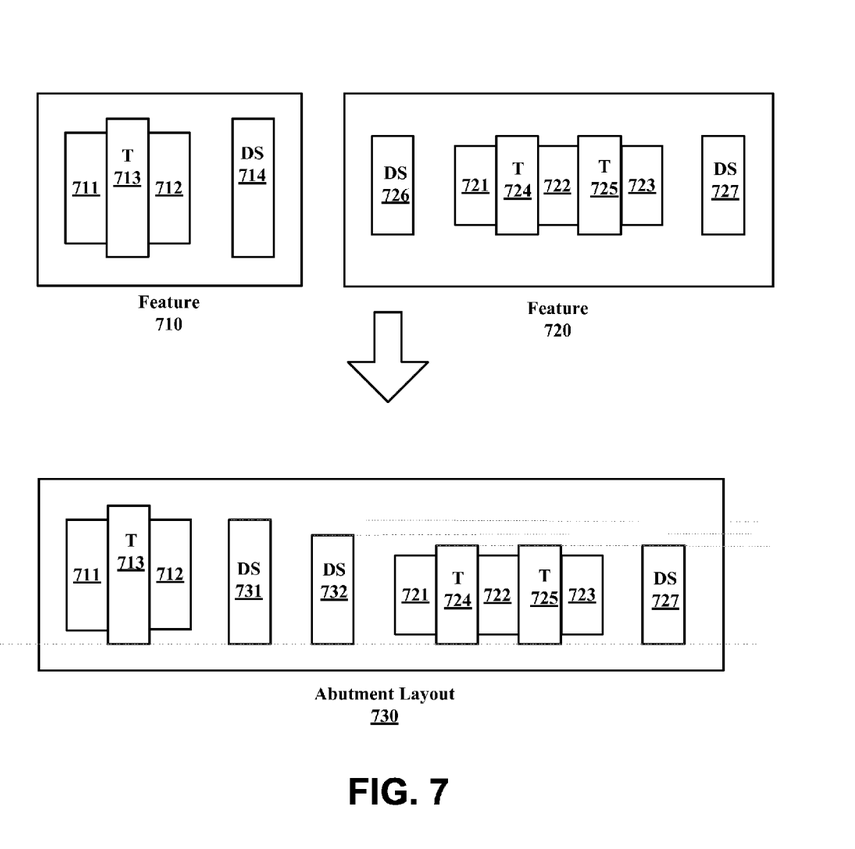

FIG. 7 is another simplified block diagram illustrating another exemplary optimization of a layout using an abutment process according to an embodiment. As shown in FIG. 7, an exemplary design may be comprised of two features 710, 720. A first feature 710 may include a transistor T 713, net connections 711 and 712, and dummy shape DS 714. A second feature 720 may include dummy shapes DS 726 and DS 727 and a device chain having transistors T 724, T 725 and net connections 721, 722 and 723.

Then if the two features 710, 720 have dummy shapes DS 714 and DS 726 in close proximity, the abutment process may resize and align the shapes of the features. Then the resultant abutment layout 730 may include three transistors T 713, T 724, and 725, net connections 711, 712, 721, 722, and 723 and dummy shapes DS 731, DS 732 and DS 727.

In this exemplary optimization, a layout rule may require that changes in shape height are adjusted gradually. An additional layout rule may require the alignment of shape edges where possible. As shown, the shapes of the abutted features may be resized and aligned. Thus, the original dummy shapes DS 714 and DS 726 have been resized and dummy shapes DS 731, DS 732, DS 727 and gates T 713, T 724, and T 725 have been shifted so that the bottom of each shape is aligned.

Figure 8:
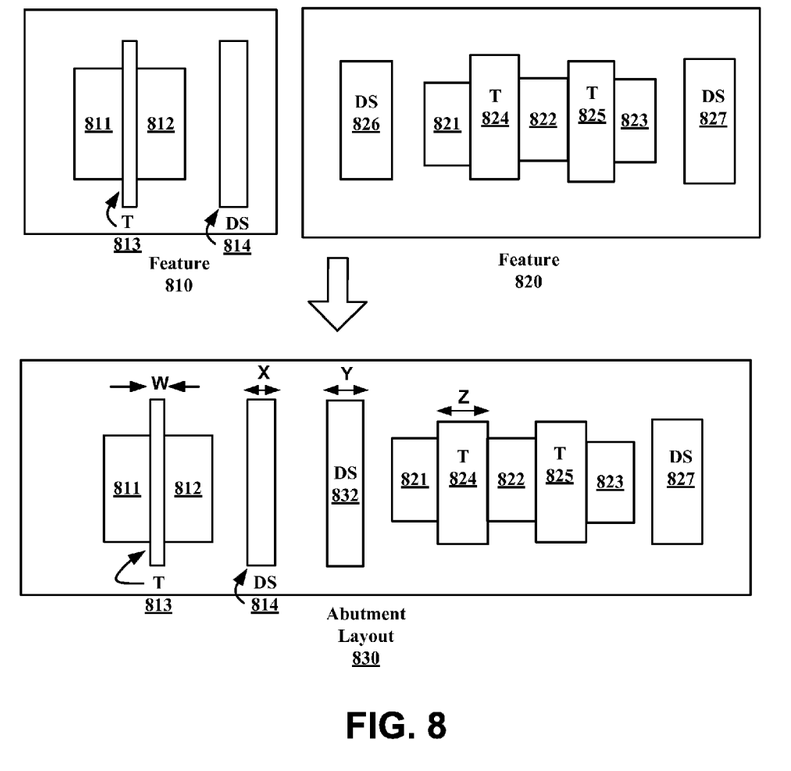

Similarly, FIG. 8 is a simplified block diagram illustrating another exemplary optimization of a layout using an abutment process according to an embodiment. As shown in FIG. 8, an exemplary design may be comprised of two features 810, 820. A first feature 810 may include a transistor T 813, net connections 811 and 812, and dummy shape DS 814. A second feature 820 may include dummy shapes DS 826 and DS 827 and a device chain having transistors T 824, T 825 and net connections 821, 822 and 823. Then if the two features, 810, 820 have dummy shapes DS 814 and DS 826 in close proximity, the abutment process may resize the shapes of each of the features.

In this exemplary optimization, a layout rule may require that changes in shape width are adjusted gradually. The resultant abutment layout 830 may include three transistors T 813, T 824, and 825, net connections 811, 812, 821, 822, and 823 and dummy shapes DS 814, DS 832 and DS 827. The original dummy shape DS 826 has been resized so that the width of the shapes gradually transitions across multiple shapes. Therefore, as shown in FIG. 8, width W<x<Y<Z.

Figure 9:
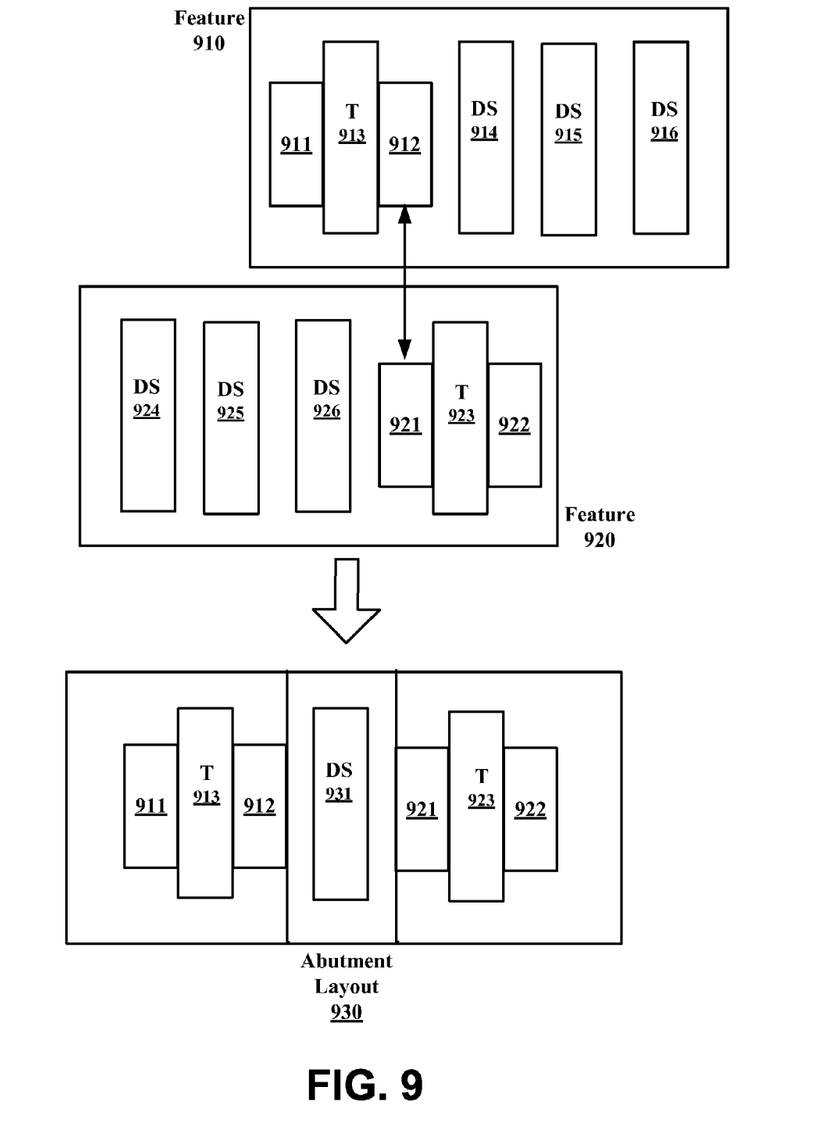

The abutment process may perform more tasks than the previously described shape adjustment, for example, in some cases the abutment process may eliminate short circuits between shapes. FIG. 9 is a simplified block diagram illustrating another exemplary optimization of a layout using an abutment process according to an embodiment. As shown in FIG. 9, an exemplary design may be comprised of two features 910, 920. A first feature 910 may include a transistor T 913, net connections 911 and 912, and dummy shapes DS 914, DS 915, and DS 916. A second feature 920 may include a transistor T 923, net connections 921 and 922, and dummy shapes DS 924, DS 925, and DS 926.

In this exemplary optimization, a layout rule may require that the transistors have a row of three dummies in the unabutted layout. However, the abutment process may eliminate the unnecessary dummy shapes. Then if the two features 910, 920 overlap in such a way that they form a short connection between net connections 912 and 921, the abutment process may reconfigure the features to resolve the short and eliminate unnecessary dummy shapes. Then the resultant abutment layout 930 may include transistors T 913 and T 923, net connections 911, 912, 921, and 922, and dummy shape DS 931. The dummy shapes DS 914, DS 915, DS 916, DS 924 and DS 925 have been optimized away.

Figure 10:
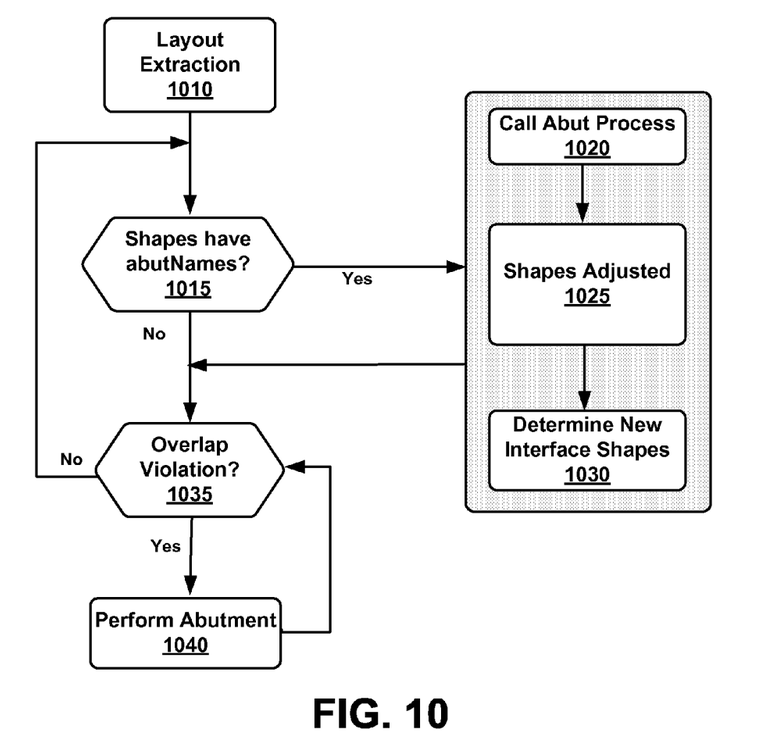
FIG. 10 is a flowchart illustrating an exemplary method for optimizing a layout using an abutment process according to an embodiment of the present invention.

FIG. 10 is a flowchart illustrating an exemplary method for optimizing a layout using an abutment process according to an embodiment of the present invention. As shown in FIG. 10, a layout may be optimized using the abutment process when a layout is extracted from a circuit design (block 1010). The layout extraction process may identify shapes for the abutment process, including, for example, overlapping shapes, shapes in close proximity, and shapes having a connection short. Then, if the abutment process has been activated or implemented for the design, the identified shapes may have abutment names and the abutment process may be initiated (block 1015). Upon initiation of the abutment process, the identified shapes and any neighboring shapes may be evaluated (block 1020). For example, if there is a short between two connected shapes, the abutment process will evaluate the problematic shapes and neighboring shapes and determine if the short can be corrected. An exemplary short correction was described with respect to FIG. 9.

Once the abutment process has identified shapes for correction, the identified shapes may then be adjusted, and one or more shapes may be resized, added or removed as needed (block 1025). The new interface shapes eligible for abutment may then be identified (block 1030). Then for each remaining overlap of interface shapes in the layout, the overlapping features may be abutted thereby moving the features together (blocks 1035, 1040).

Figure 11A:
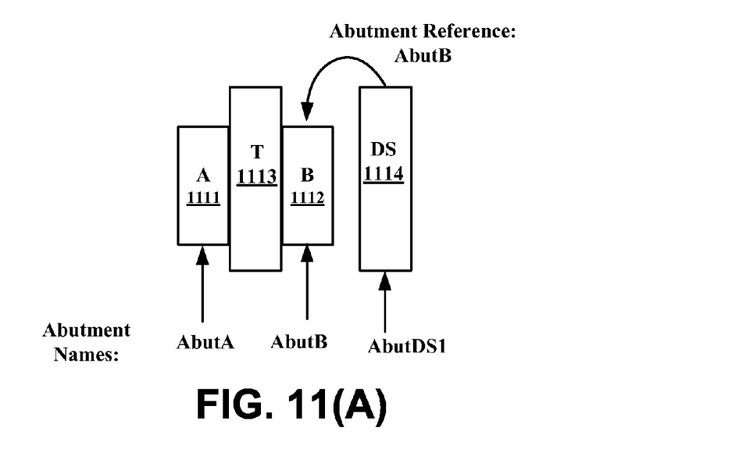
FIGS. 11(A)-(B) are simplified block diagrams illustrating exemplary naming conventions for layout features for a system implementing an abutment process according to an embodiment of the present invention.

FIG. 11(A) is a simplified block diagram illustrating exemplary naming conventions for layout features for a system implementing an abutment process according to an embodiment of the present invention. To identify shapes for the abutment process, each shape which may trigger the abutment process may be given an unique identifier or abutment name. As shown in FIG. 11(A), each shape in a feature is given an abutment name. For example, net connection A 1111 has abutment name 'AbutA', net connection B 1112 has abutment name 'AbutB', and dummy shape DS 1114 has abutment name 'AbutDS1'. As shown, transistor T 1113 may not be assigned an abutment name where the transistor T1113 is not eligible for abutment.

Each abuttable dummy shape may also be assigned an abutment reference name that identifies the abutment name of the shape to be used as the interface shape if the dummy shape is removed from the feature. As shown in FIG. 11(A), dummy shape DS 1114 has reference name 'AbutB' identifying net connection B 1112 as the interface shape for the feature if dummy shape DS 1114 is removed or otherwise optimized away. Each shape may be uniquely identified by a feature identifier and abutment name.

Figure 11B:
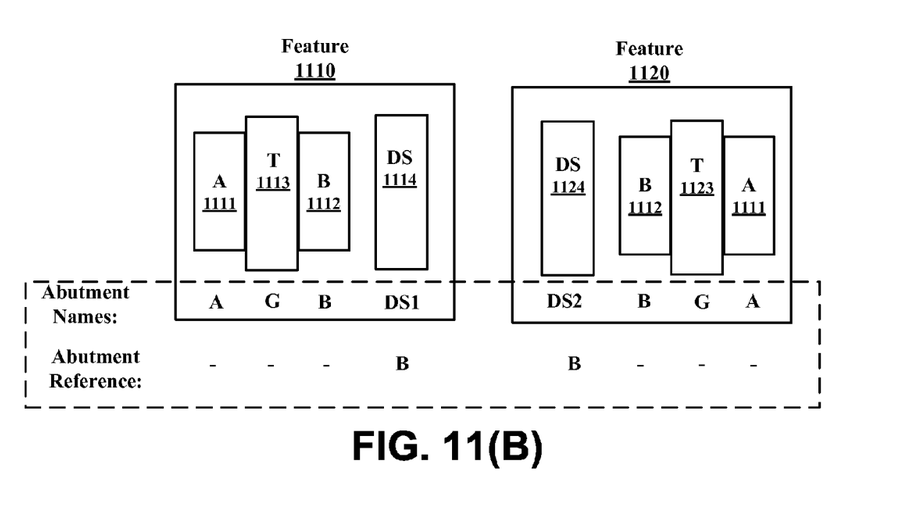

FIG. 11(B) is a simplified block diagram illustrating exemplary naming conventions for layout features for a system implementing an abutment process according to an embodiment of the present invention. The shapes may be identified for the abutment process in neighboring or overlapping features 1110, 1120. The abutment process may have predefined rules that allow the dummy shapes to be removed and the drain terminals merged (net connections B 1112 in each feature). An exemplary abutment process for the illustrated features 1110, 1120 was described with respect to FIG. 4.

According to an aspect of an exemplary embodiment, additional or non-conventional abutments may be triggered by the placement of the features and therefore may be assigned an abutment name. For example, the transistors and gates may be eligible for abutment in the vertical direction.

Figure 12:
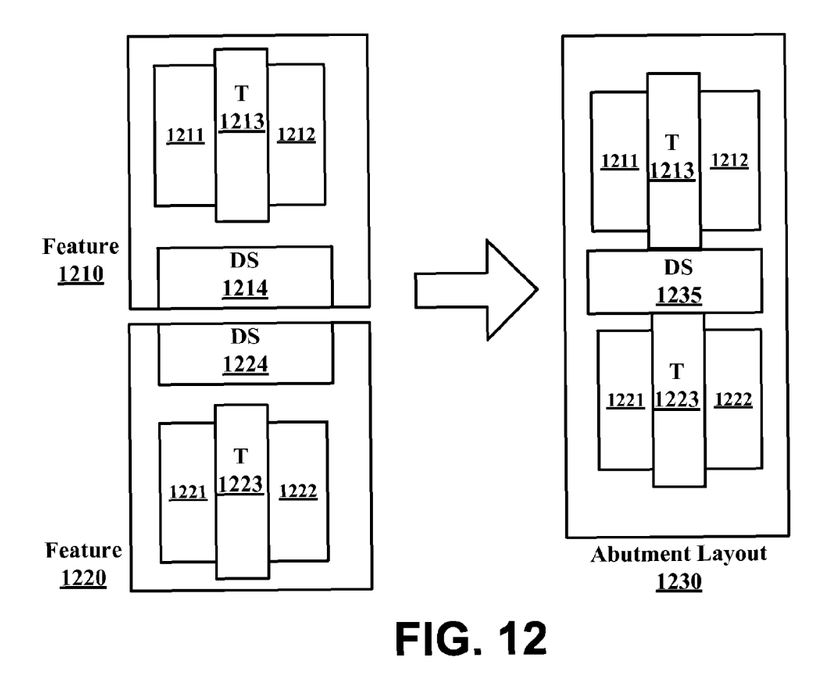
FIG. 12 is a simplified block diagram illustrating an exemplary optimization of a layout using an abutment process according to an embodiment.

FIG. 12 is a simplified block diagram illustrating an exemplary optimization of a layout using an abutment process according to an embodiment. As shown in FIG. 12, an exemplary design may be comprised of two features 1210, 1220. A first feature 1210 may include a transistor T 1213, net connections 1211 and 1212, and dummy shape DS 1214. A second feature 1220 may include a transistor T 1223, net connections 1221 and 1222, and dummy shape DS 1224. Then the abutment process may detect a potential abutment between adjacent vertical features 1210 and 1220. The resultant abutment layout 1230 may include a first and a second transistor T 1213, T 1223, net connections 1211, 1212, 1221, and 1222, and a single dummy shape 1235.

Figure 13:
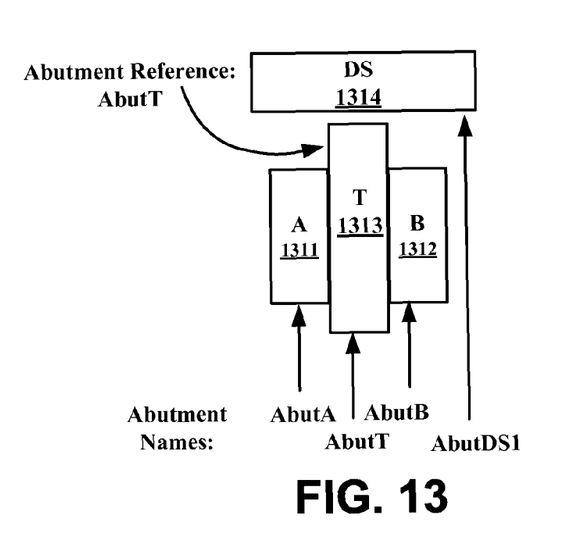
FIG. 13 is a simplified block diagram illustrating exemplary naming conventions for layout features for a system implementing an abutment process according to an embodiment of the present invention.

FIG. 13 is a simplified block diagram illustrating exemplary naming conventions for layout features for a system implementing an abutment process according to an embodiment of the present invention. As shown in FIG. 13, each shape in a feature may be given an abutment name. For example, net connection A 1311 has abutment name 'AbutA', net connection B 1312 has abutment name 'AbutB', the transistor gate T 1313 has abutment name 'AbutT', and dummy shape DS 1314 has abutment name 'AbutDS1'.

As previously noted, each abuttable dummy shape may also be assigned an abutment reference name that identifies the abutment name of the shape to be used as the interface shape if the dummy shape is removed from the feature. As shown in FIG. 13, dummy shape DS 1314 has reference name 'AbutT' identifying transistor T 1312 as the interface shape for the feature if dummy shape DS 1314 is removed or otherwise optimized away.

Although the above embodiments are primarily described with reference to adding, removing, or resizing shapes, different feature transformations may be implemented with defined layout rules to accommodate alternate fabrication processes and design rules. For example, alternate transformations may include changing the layer or connectivity of the shapes. Additionally, the approach may have applicability in other technologies where the abutment of features may be used to obtain area savings in the layout, or where the introduction and removal of shapes can lead to improved device performance or device yield.

In some applications, the modules described hereinabove may be provided as elements of an integrated software system, in which the blocks may be provided as separate elements of a computer program. Some embodiments may be implemented, for example, using a non-transitory computer-readable storage medium or article which may store an instruction or a set of instructions that, if executed by a processor, may cause the processor to perform a method in accordance with the disclosed embodiments. Other applications of the present invention may be embodied as a hybrid system of dedicated hardware and software components. Moreover, not all of the modules described herein need be provided or need be provided as separate units. Such implementation details are immaterial to the operation of the present invention unless otherwise noted above.

The exemplary methods and computer program instructions may be embodied on a non-transitory machine readable storage medium. In addition, a server or database server may include machine readable media configured to store machine executable program instructions. The features of the embodiments of the present invention may be implemented in hardware, software, firmware, or a combination thereof and utilized in systems, subsystems, components or subcomponents thereof. The "machine readable storage media" may include any medium that can store information. Examples of a machine readable storage medium include electronic circuits, semiconductor memory device, ROM, flash memory, erasable ROM (EROM), floppy diskette, CD-ROM, optical disk, hard disk, fiber optic medium, or any electromagnetic or optical storage device.

While the invention has been described in detail above with reference to some embodiments, variations within the scope and spirit of the invention will be apparent to those of ordinary skill in the art. Thus, the invention should be considered as limited only by the scope of the appended claims.

What is claimed is:

1. A method for using a processor to optimize an integrated circuit design layout, comprising:
   in a layout stored in a memory device, identifying with the processor a plurality of features placed within a predetermined proximity to each other for an abutment process;
   identifying with the processor one or more shapes in the plurality of features that are placed within a predetermined proximity to each other, the identified shapes being in features which are not connected via a netlist for the design, wherein the netlist defines connections between features;
   with the processor, altering the stored layout by adjusting the identified shapes; and
   with the processor, altering the stored layout by abutting two or more features in the identified plurality of features that are placed within a predetermined proximity to each other.

2. The method of claim 1, wherein said identifying a plurality of features further comprises identifying a short circuit between two features.

3. The method of claim 1, wherein said identifying a plurality of features further comprises identifying overlapping features.

4. The method of claim 1, further comprising:
for each feature in the identified plurality of features, identifying a neighboring feature within a predetermined proximity thereto.

5. The method of claim 1, wherein said adjusting includes adding a shape to an identified feature.

6. The method of claim 1, wherein said adjusting includes resizing an identified shape.

7. The method of claim 1, wherein said adjusting includes removing an identified shape from an identified feature.

8. The method of claim 7, further comprising:
identifying a shape of the identified feature as the interface shape after said removing; and
adding the neighboring feature to the plurality of features.

9. The method of claim 1, wherein each shape is associated with a unique identifier.

10. The method of claim 9, wherein each identified shape is associated with the unique identifier for a shape that will act as an interface shape for the identified feature if an original interface shape is optimized away.

11. The method of claim 1, wherein said adjusting is determined according a set of predefined layout rules.

12. A non-transitory computer readable medium storing instructions that when executed by a processor perform a method comprising:
identifying a plurality of features placed within a predetermined proximity to each other for an abutment process;
identifying one or more shapes in the plurality of features that are placed within a predetermined proximity to each other, the identified shapes being in features which are not connected via a netlist for the design, wherein the netlist defines connection between features;
adjusting the identified shapes; and
abutting two or more features in the identified plurality of features that are placed within a predetermined proximity to each other.

13. The computer readable medium of claim 12, wherein a plurality of predefined layout rules are stored on said medium.

14. The computer readable medium of claim 13, wherein said adjusting is determined according the predefined layout rules.

15. The computer readable medium of claim 12, wherein each shape is associated with a unique identifier.

16. A system comprising:
a memory to store a layout and plurality of predefined layout rules;
a processor executing instructions configured to:
identify a plurality of features placed within a predetermined proximity to each other for an abutment process;
identify one or more shapes in the plurality of features that are placed within a predetermined proximity to each other, the identified shapes being in features which are not connected via a netlist for the design, wherein the netlist defines connection between features;
adjust the identified shapes; and
abut two or more features in the identified plurality of features that are placed within a predetermined proximity to each other.

17. The system of claim 16, wherein a plurality of predefined layout rules are stored in said memory.

18. The system of claim 17, wherein the instructions are further configured to adjust the identified shapes according the predefined layout rules.

* * * * *